United States Patent [19]

Davidson et al.

[11] Patent Number: 4,922,185
[45] Date of Patent: May 1, 1990

[54] DIAGNOSTIC METER BASE

[76] Inventors: Gordon O. Davidson, 467 Mooney Crescent, Orillia, Ontario; Barry C. Mitchell, Purvis Street, R.R. #1, Stroud, Ontario; Larry A. White, 34 Murray Street, Barrie, Ontario, all of Canada

[21] Appl. No.: 306,301

[22] Filed: Feb. 3, 1989

[51] Int. Cl.⁵ .................. G01R 31/08; G01R 1/38; G08B 21/00
[52] U.S. Cl. .................. 324/74; 324/157; 324/542; 340/642
[58] Field of Search .......... 324/74, 158 F, 73 PC, 324/158 P, 156, 157, 133, 539, 542; 340/642, 635, 641, 653

[56] References Cited

U.S. PATENT DOCUMENTS

| | | |
|---|---|---|
| 1,933,274 | 10/1933 | Ludwig . |
| 2,066,299 | 12/1936 | Mylus . |
| 2,218,650 | 10/1940 | Larson . |
| 2,249,075 | 7/1941 | Young et al. . |
| 2,890,413 | 6/1959 | Screven . |
| 2,933,360 | 4/1960 | Adams . |
| 4,271,390 | 6/1981 | Canu . |
| 4,646,003 | 2/1987 | Phillips et al. .......... 324/74 |

FOREIGN PATENT DOCUMENTS 0104271  5/1986  Japan ................ 324/158 F

OTHER PUBLICATIONS

Derfler, Jr., F. J.; "Overview -RS-232C Adapter"; Microprocessing; Feb. 1984; pp. 16, 20.

*Primary Examiner*—Ernest F. Karlsen
*Attorney, Agent, or Firm*—Ridout & Maybee

[57] ABSTRACT

A diagnostic meter base, used for testing the connections of a self-contained meter in a polyphase installation is described. The diagnostic meter base comprises a box-like casing, one end of which defines a socket with contacts to engage respective contacts of the meter, and the other end of which defines a plug with contacts to engage respective contacts of a permanent support socket of the installation. The casing houses a network of circuit elements each including a lamp which responds to current through the element, whereby the pattern of lamp responses is indicative of the pattern connections in the installation. The lamp bulbs are mounted in a well at one end of the casing, the well having a hinged cover.

3 Claims, 4 Drawing Sheets

DIAGNOSTIC METER BASE

FIELD OF THE INVENTION

This invention relates to a device for testing the connections of a detachable instrument installation of the kind in which the detachable instrument provides a set of line contacts and a set of load contacts which are positioned to engage respective contacts of a support socket providing connections to a polyphase electrical supply and to a load circuit. The detachable instrument may be a watt-hour meter. The contacts of the instrument are usually blade contacts which engage and are received by spring jaw contacts of the supply socket. An installation of this kind is described, for example, in U.S. Pat. No. 2,249,075.

BACKGROUND OF THE INVENTION

There are a number of polyphase, typically three-phase, measuring instruments which record power consumption without any external measuring devices. Such an instrument is referred to as a "self-contained meter" and is used on 240 volt and 600 volt delta connected systems and also on two-phase network systems. The latter systems are commonly used, for example, in condominium complexes. These instruments have five connection points positioned to engage respective contacts of a support socket connected to the supply and to the load. Four of the connection points are fixed while the fifth may be positioned as required for the particular installation. In operation of the instrument, if the fifth pin is not connected up, the instrument will register less energy than is actually used. After installation, one can readily determine whether the instrument is measuring power, but one cannot easily determine whether the instrument is measuring all the power that is consumed.

It is an object of the present invention to provide a testing device which can be inserted between the instrument and the support socket, the device being operable to indicate the correctness or otherwise of the connections between the detachable instrument and the power lines.

SUMMARY OF THE INVENTION

A testing device according to the invention comprises an insert providing a pair of opposite end faces, one end face being configured to form a socket for receiving and engaging the detachable instrument and the other end face being configured to form a plug for engaging the support socket. The said one end face provides a first set of contacts positioned to engage respective contacts of the instrument while the other end face provides a second set of contacts positioned to engage respective contacts of the support socket. The insert is in the form of a housing which houses a network of circuit elements interconnecting the contacts of the first and second sets of contacts in pairs, each circuit element including a voltage-responsive visual indicator, which visual indicators are arranged so that, when the insert is installed between the support socket and the instrument, the pattern of indicator responses corresponds to the pattern of connections of the installation.

BRIEF DESCRIPTION OF THE DRAWINGS

A preferred embodiment of the invention will now be described, by way of example, with reference to the accompanying drawings. In the drawings.

DESCRIPTION OF THE PREFERRED EMBODIMENT

Figure 1:
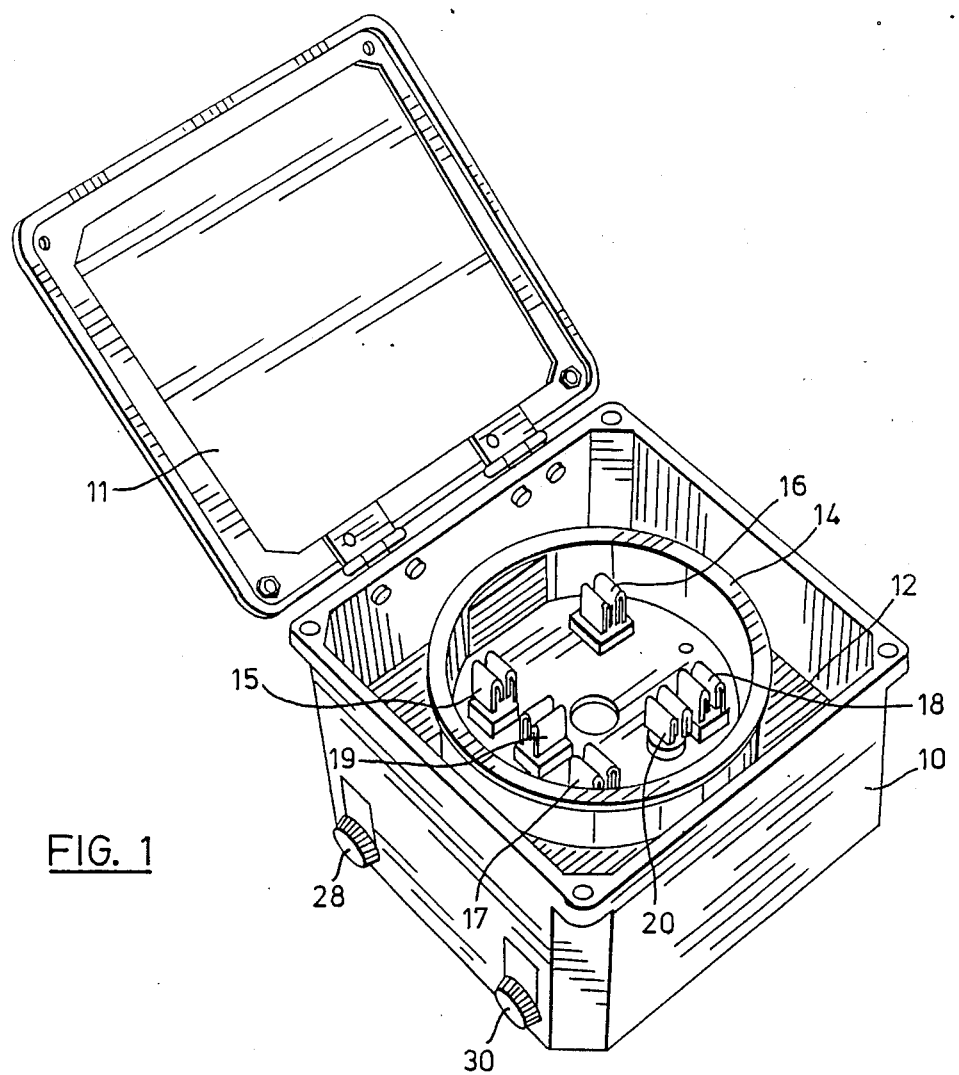
FIG. 1 is a perspective view of a testing device for testing the connections of a detachable instrument installation of the kind referred to above, the device having a hinge cover which is shown in the open position.

The device shown in the drawings is designed for use with a "self-contained meter" such as is used on 240 volt or 600 volt delta connected systems and having five connection points provided by blade contacts positioned to engage respective jaw contacts of a support socket. For use in testing, the device is intended to be inserted between the support socket and the meter.

Figure 3:
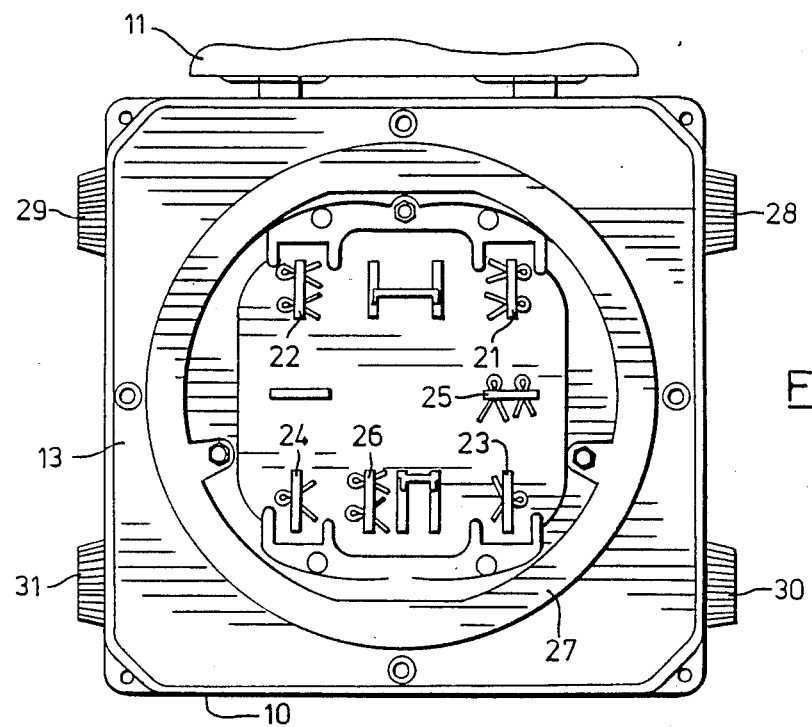
FIG. 3 is an underneath plan view of the device.
Figure 4:
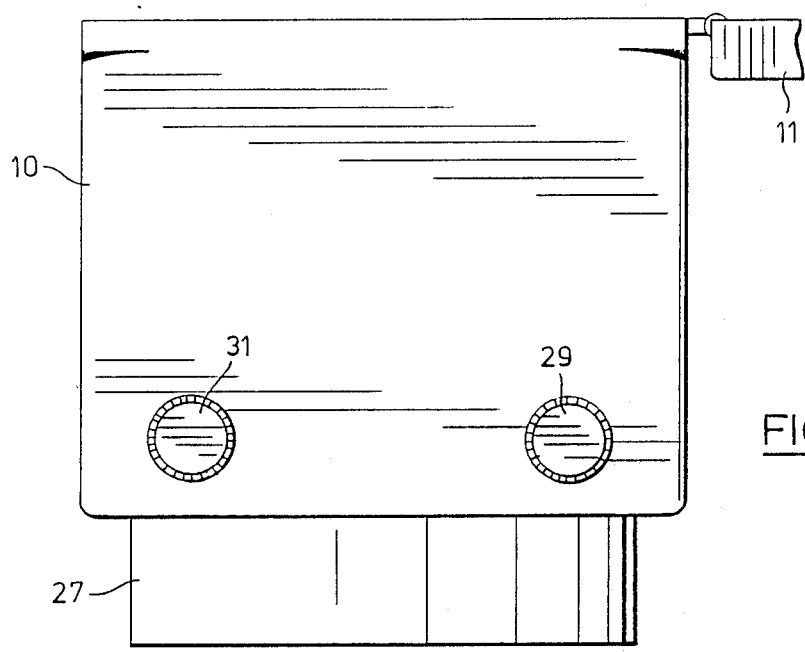
FIG. 4 is a side elevational view of the device.

Referring to the drawings, the testing device comprises a box like casing 10 having a hinged cover 11 at its upper end. The upper end of the casing 10 is formed as a well having a floor 12 defining an upper end face of a housing for the circuitry shown in FIG. 5. The lower end face of the housing, 13, is shown in FIG. 3. A cylindrical upstanding wall 14 projecting from the end face 12, but wholly contained within the well beneath the hinged cover 11, defines a socket for receiving a plug portion of the meter, and encloses an area of the end face 12 from which six jaw contacts 15, 16, 17, 18, 19 and 20 project, these jaw contacts being positioned in the same manner as those of the support socket of the installation in question so as to receive the respective blade contacts of the plug portion of the meter. As previously mentioned, the meter provides five connection points, four of which are fixed and the fifth being provided by a "movable" contact. In the illustrated device, the jaw contacts 19 and 20 provide alternative connections for the "movable" contact.

The bottom end face 13 of the device is configured so as to constitute a plug to engage in the support socket. To this end, a cylindrical wall 27 projecting from the end face 13 encloses an area of the end face from which six blade contacts 21, 22, 23, 24, 25 and 26 project. These blade contacts are arranged in a configuration corresponding to that of the jaw contacts 15–20, thus being positioned to engage respective jaw contacts of the support socket. In other words, the configuration of the bottom end face 13 of the device defines a plug corresponding to the plug portion of the meter, so as to engage in the support socket, while the configuration of the upper end face 12 defines a complementary socket corresponding to the support socket, so as to receive the plug portion of the meter.

Figure 5:
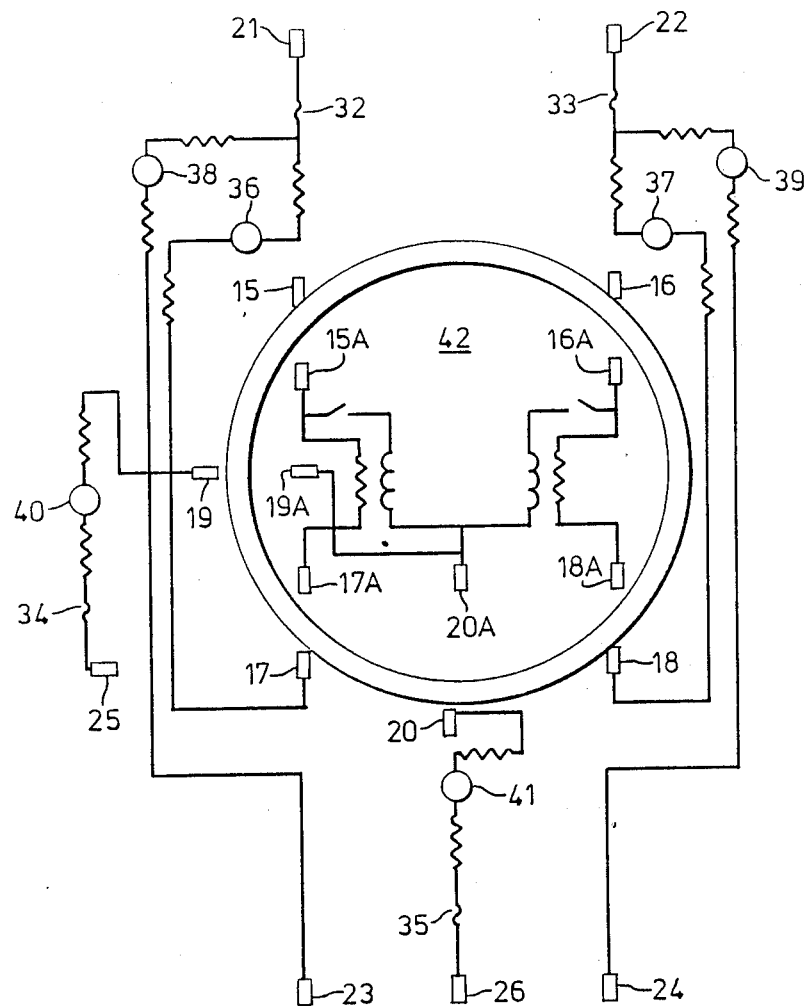
FIG. 5 is a schematic wiring diagram showing a network of circuit elements housed in the device, as well as the basic circuitry of a detachable instrument with which the device is to be used.

FIGS. 1 to 4 show the positions of fuse caps 28, 29, 30 and 31 of the fuses 32, 33, 34 and 35 shown in FIG. 5.

Figure 2:
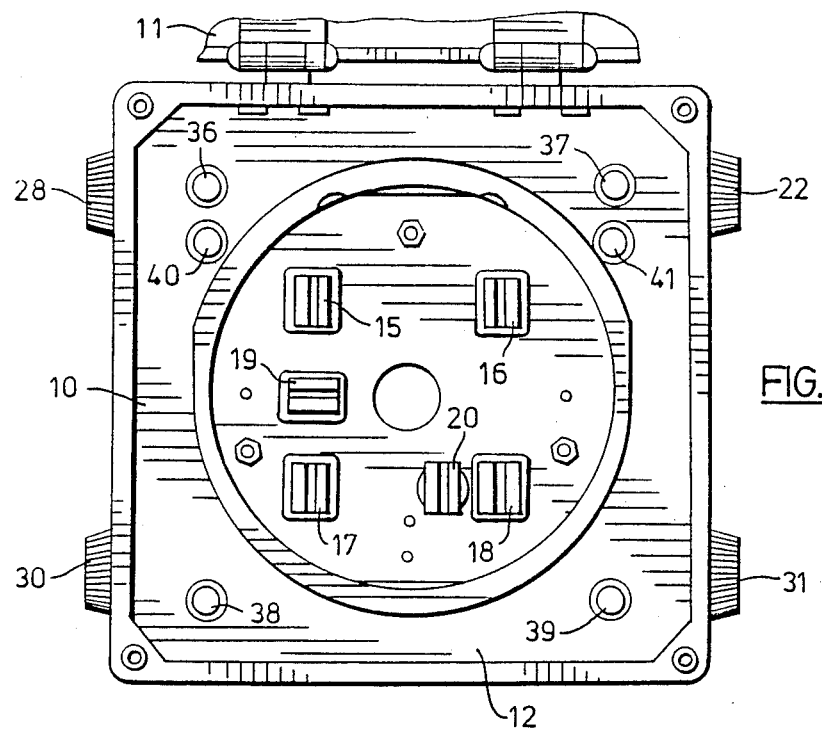
FIG. 2 is a top plan view of the testing device.

Referring now to FIG. 2 in particular, a plurality of visual indicators constituted by neon lamp bulbs 36, 37, 38, 39, 40 and 41 are mounted in the floor panel 12. These lamp bulbs are connected in respective circuit elements of the network illustrated in FIG. 5 so as to respond to current through the circuit elements. As described hereinafter, the pattern of responses of the visual indicators reveals the pattern of connections of the installation and so reveals the correctness or otherwise of the installation connections.

An important feature of this arrangement is that the positioning of the indicator lamp bulbs, which are set in the floor of the well, permits easy identification of a lit bulb in bright sunlight.

The jaw contacts 15-20 and the blade contacts 21-26 are denoted by the same reference numerals in the wiring diagram of FIG. 5. The jaw contacts 15-20 are respectively positioned to engage the appropriate blade contacts 15A-20A of the self-contained meter 42. The meter 42 does not form part of the present invention, but is indicated schematically in FIG. 5 for the purpose of showing the various current flow paths when the meter is installed with the testing device. The blade contacts 21-26 are positioned to engage the appropriate contacts of the support socket, not shown. More specifically, the engagements of the various contacts of the testing device are set out in the following Table 1.

TABLE 1

| Contact No. | Engages with |
|---|---|
| 15 | Meter terminal 15A |
| 16 | Meter terminal 16A |
| 17 | Meter terminal 17A |
| 18 | Meter terminal 18A |
| 19 | Meter terminal 19A |
| 20 | Meter terminal 20A |
| 21 | Line terminal - Red Phase |
| 22 | Line terminal - Blue Phase |
| 23 | Load terminal - Red Phase |
| 24 | Load terminal - Blue Phase |
| 25 | Load terminal - White Phase |
| 26 | Load terminal - White Phase-Alternative. |

The jaw contacts 17-20 are interconnected by a network of circuit elements, each consisting of a respective one of the neon lamp bulbs 36-41 with series resistors and these circuit elements being protected by fuses 43, 44, 45 and 46.

It will now be readily seen that, when the testing device is installed, the various possible configurations denote the following conditions:

1. If only lamps 36, 37 and 40, or lamps 36, 37 and 41 are lit, the installation connections are correct.
2. If lamp 37 is not lit, the blue phase is missing.
3. If lamp 36 is not lit, the red phase is missing.
4. If neither lamp 40 nor lamp 41 is lit, the white phase is missing.
5. In addition to the preceding conditions, if either lamp 38 or lamp 39 is lit, this indicates that a load is connected. Installing a meter into a connected load with the power on could be hazardous to the installer.

The device can be used in a two-phase network system, in which case the white (or the red or the blue) phase connections referred to above would be to the neutral.

The invention thus provides a diagnostic meter base which can be used to confirm the correctness or otherwise of meter installations, and which can be used to identify a number of problematic conditions including the following:

1. No supply voltage at the meter due to the conductors not being connected in the meter base; the conductors not being connected at the source; the source not being energized; or a primary fuse being blown.
2. No voltage at the movable contact on the meter due to the pin being positioned incorrectly at the right location; the pin being in the wrong location; the conductor not being connected in the meter base; the conductor not being connected at the source; or a primary fuse being blown.
3. The potential circuit in the meter being open due to an open coil in the meter; or due to the isolating device on the back of the meter being open.
4. The current circuit in the meter being open.
5. The load being connected to the meter. The casing 10 and its hinged cover 11 are, of course, of insulating material such as, for example, molded PVC.

What we claim is:

1. A device for testing the connections of a detachable instrument installation of the kind in which the detachable instrument provides a set of line contacts and a set of load contacts positioned to engage respective contacts of a support socket providing connections to a polyphase electrical supply and a load circuit connected to the supply, the device comprising:

an insert providing a pair of opposite end faces configured respectively to engage the support socket and to receive the instrument in supporting relation thereto, one end face providing a first set of contacts positioned to engage respective contacts of the support socket and the other end face providing a second set of contacts positioned to engage respective contacts of the instrument, said insert housing a network of circuit elements interconnecting the contacts of said first and second sets in pairs, each said circuit element including a current-responsive visual indicator, and said indicators being physically arranged in a predetermined configuration such that, when the insert is installed between the support socket and the instrument the pattern of indicator responses is determined by the pattern of connections of the installation wherein the insert comprises a box-like casing with one end formed as a well having a floor defining said one end face of the insert, said one end of the casing having a hinged cover, and wherein the visual indicators are mounted in the floor of the well.

2. A testing device according to claim 2, wherein the well has an upstanding cylindrical wall projecting from the floor and defining therewith a socket to receive a plug portion of a detachable instrument.

3. A testing device according to claim 2, wherein said other end face provides an upstanding cylindrical wall projecting therefrom and defining with said other end face a plug to engage a support socket.

* * * * *